(12) United States Patent
Fujisawa et al.

(10) Patent No.: US 7,897,717 B2
(45) Date of Patent: Mar. 1, 2011

(54) INSULATING LIQUID DIE-BONDING AGENT AND SEMICONDUCTOR DEVICE

(75) Inventors: Toyohiko Fujisawa, Chiba (JP); Yoshito Ushio, Chiba (JP)

(73) Assignee: Dow Corning Toray Company, Ltd., Tokyo (JP)

(*) Notice: Subject to any disclaimer, the term of this patent is extended or adjusted under 35 U.S.C. 154(b) by 98 days.

(21) Appl. No.: 12/065,135

(22) PCT Filed: Aug. 23, 2006

(86) PCT No.: PCT/JP2006/317033
§ 371 (c)(1),
(2), (4) Date: Feb. 28, 2008

(87) PCT Pub. No.: WO2007/026727
PCT Pub. Date: Mar. 8, 2007

(65) Prior Publication Data
US 2009/0263936 A1 Oct. 22, 2009

(30) Foreign Application Priority Data
Aug. 29, 2005 (JP) ............................. 2005-246970

(51) Int. Cl.
*C08G 77/20* (2006.01)
(52) U.S. Cl. ............................. 528/32; 528/31; 524/442
(58) Field of Classification Search .................. 528/32, 528/31; 524/442
See application file for complete search history.

(56) References Cited

U.S. PATENT DOCUMENTS

| | | | |
|---|---|---|---|
| 4,742,142 A | 5/1988 | Shimizu et al. | |
| 4,761,454 A | 8/1988 | Oba et al. | |
| 4,849,564 A | 7/1989 | Shimizu et al. | |
| 5,969,039 A | 10/1999 | Kobayashi et al. | |
| 6,017,587 A * | 1/2000 | Kleyer et al. ................. | 427/387 |
| 6,231,974 B1 | 5/2001 | Yamakawa et al. | |

FOREIGN PATENT DOCUMENTS

| | | | |
|---|---|---|---|
| EP | 0309722 A1 | 4/1989 | |
| EP | 0971367 A1 | 1/2000 | |
| JP | 62243621 A | 10/1987 | |
| JP | 07014859 A | 1/1995 | |
| JP | 07292343 A | 11/1995 | |
| JP | 10298302 A | 11/1998 | |
| JP | 2000-038510 A | 2/2000 | |
| JP | 2001-240679 A | 9/2001 | |
| JP | 2003-292781 A | 10/2003 | |
| WO | WO 2006-001458 A2 | 1/2006 | |
| WO | WO 2006-040964 A1 | 4/2006 | |
| WO | WO 2006-070903 A1 | 7/2006 | |
| WO | WO 2006-104236 A1 | 10/2006 | |
| WO | WO 2006-135036 A1 | 12/2006 | |

OTHER PUBLICATIONS

English language abstract for JP 62243621 extracted from espacenet.com database dated Oct. 24, 2008.
English language translation and abstract for JP 07-014859 extracted from Searching PAJ database dated Oct. 24, 2008, 19 pages.
English language translation and abstract for JP 07-292343 extracted from Searching PAJ database dated Oct. 24, 2008, 51 pages.
English language translation and abstract for JP 10-298302 extracted from Searching PAJ database dated Oct. 27, 2008, 29 pages.
English language translation and abstract for JP 2000-038510 extracted from Searching PAJ database dated Oct. 24, 2008, 64 pages.
English language translation and abstract for JP 2001-240679 extracted from Searching PAJ database dated Oct. 27, 2008, 49 pages.
English language translation and abstract for JP 2003-292781 extracted from Searching PAJ database dated Oct. 24, 2008, 41 pages.
PCT International Search Report for PCT/JP2005/011864, Jan. 20, 2006, 5 pages.
PCT International Search Report for PCT/JP2005/018405, Mar. 22, 2006, 6 pages.
PCT International Search Report for PCT/JP2005/024196, Mar. 20, 2006, 3 pages.
PCT International Search Report for PCT/JP2006/306996, Jul. 18, 2006, 3 pages.
PCT International Search Report for PCT/JP2006/312088, Sep. 22, 2006, 3 pages.
PCT International Search Report for PCT/JP2006/317033, Nov. 27, 2006, 3 pages.

* cited by examiner

Primary Examiner — Kuo-Liang Peng
(74) Attorney, Agent, or Firm — Howard & Howard Attorneys PLLC

(57) ABSTRACT

An insulating liquid die-bonding agent for bonding a semiconductor-chip-mounting member to an active surface of a semiconductor chip, said agent comprising: (A) a mixture of (a-1) an organopolysiloxane resin having alkenyl groups and (a-2) a linear-chain organopolysiloxane having in one molecule at least two alkenyl groups; (B) an organopolysiloxane having in one molecule at least two silicon-bonded hydrogen atoms; (C) an organic silicon compound having in one molecule at least one silicon-bonded alkoxy groups; (D) insulating spherical silicone rubber particles having an average diameter of 0.1 to 50 μm and having a type A durometer hardness according to JIS K 6253 equal to or below 80; and (E) a hydrosilylation-reaction catalyst, may not damage the active surface of the semiconductor chip, is well suited for screen printing, is resistant to the formation of voids on the interface between the semiconductor chip and the die-bonding agent, and does not lose its wire-bonding properties.

12 Claims, 1 Drawing Sheet

INSULATING LIQUID DIE-BONDING AGENT AND SEMICONDUCTOR DEVICE

RELATED APPLICATIONS

This application claims priority to and all the advantages of International Patent Application No. PCT/JP2006/317033, filed on Aug. 23, 2006, which claims priority to Japanese Patent Application No. JP 2005-246970, filed on Aug. 29, 2005.

TECHNICAL FIELD

The present invention relates to an insulating liquid die-bonding agent for bonding a semiconductor-chip bonding member to an active surface of a semiconductor chip and to a semiconductor device with the use of the aforementioned die-bonding agent.

BACKGROUND ART

In order to provide insulation conditions between a semiconductor chip and a chip-mounting member which are bonded to each other via an insulating liquid die-bonding agent or in order to prevent loss of wire bondability to the semiconductor chip after die bonding is completed, it was proposed to use an agent of the aforementioned type that contains at least 5 mass % of insulating grains made in the form of inorganic insulating bodies such as glass, metal nitride, or metal oxide particles having a diameters in the range of 50 to 100 μm (see Japanese Unexamined Patent Application Publication No. (hereinafter referred to as "Kokai") H7-14859). Alternatively, the aforementioned insulating liquid die-bonding agent can be composed of an organopolysiloxane having in one molecule at least two alkenyl groups, an organopolysiloxane having in one molecule at least two silicon-bonded hydrogen atoms, an organic silicon compound having a silicon-bonded alkoxy group, organic or inorganic spherical filler particles having diameters in the range of 10 to 100 μm and a ratio of the large diameter to the short diameter in the range of 1.0 to 1.5, and a platinum or platinum-type catalyst (see Kokai H7-292343).

In order to provide insulation conditions between a semiconductor chip and a chip-mounting member or in order to prevent loss of wire bondability to the semiconductor chip after die bonding, the aforementioned insulating liquid die bonding agents should contain a relatively hard filler. However, when such an insulating liquid die bonding agent is used for bonding a semiconductor-mounting element to an active face of a semiconductor chip in a face-down-type semiconductor device that is subject to heat cycles, then the active surface of the aforementioned semiconductor chip may be damaged, and reliability of the semiconductor device may be impaired.

On the other hand, known in the art are silicone rubber compositions that contain spherical silicone rubber particles (see Kokai 2000-38510 and Kokai 2003-292781). In both cases, the composition contains conductive metal particles. Such compositions cannot be used in conjunction with wire-bonded semiconductor devices of a face-down type wherein semiconductor-chip-mounting members are bonded to active surfaces of the semiconductor chips.

The inventors herein tried to prepare an insulating die-bonding agent as a conductive silicone rubber composition with spherical silicone rubber particles but without the use of conductive metal particles. However, when such an agent is used in screen printing on the surface of a semiconductor chip mounting member, the silicone rubber composition flows to the peripheral part of the coated area, thus causing contamination of the bonding pad. This, in turn, either impairs wire bonding conditions or traps air on the interface between the semiconductor chip and the die-bonding agent, thus facilitating the formation of voids.

It is an object of the present invention to provide an insulating liquid die-bonding agent for bonding a semiconductor-chip bonding member to an active surface of a semiconductor chip that does not damage the active surface of the semiconductor chip, is well suited for screen printing, is resistant to the formation of voids on the interface between the semiconductor chip and the die-bonding agent, and does not lose its wire-bonding properties. It is another object of the invention to provide a semiconductor device of high reliability.

DISCLOSURE OF INVENTION

The insulating liquid die-bonding agent of the invention for bonding a semiconductor-chip-mounting member to an active surface of a semiconductor chip comprises:

(A) 100 parts by mass of a mixture of (a-1) an organopolysiloxane resin composed of siloxane units of formula $R^1_3SiO_{1/2}$, siloxane units of formula $R^1_2R^2SiO_{1/2}$, and siloxane units of formula $SiO_{4/2}$ (wherein $R^1$ is a univalent hydrocarbon group, except for an alkenyl group, and $R^2$ is an alkenyl group) and (a-2) a linear-chain organopolysiloxane having in one molecule at least two alkenyl groups {with a mass ratio of (a-1) to (a-2) in the range of (30:70) to (60:40)};

(B) an organopolysiloxane having in one molecule at least two silicon-bonded hydrogen atoms {this component being used in such an amount that the mole ratio of the silicon-bonded hydrogen atoms of this component to 1 mole of alkenyl groups of component (A) is within the range of 0.1 to 10 moles};

(C) 0.1 to 10 parts by mass of an organic silicon compound having in one molecule at least one silicon-bonded alkoxy group;

(D) 5 to 50 parts by mass of insulating spherical silicone rubber particles having an average diameter of 0.1 to 50 μm and having a type A durometer hardness according to JIS K 6253 equal to or below 80; and (E) a catalytic quantity of a hydrosilylation-reaction catalyst.

A semiconductor device of the invention is characterized by the fact that a semiconductor chip mounting member is bonded to the active surface of the semiconductor chip with the use of the aforementioned insulating liquid die-bonding agent.

EFFECTS OF INVENTION

The die-bonding agent of the present invention does not damage the active surface of a semiconductor chip, is well suited for screen printing, is resistant to the formation of voids on the interface between the semiconductor chip and the die-bonding agent, and does not lose its wire-bonding properties.

Due to the use of the aforementioned insulating liquid die-bonding agent, a semiconductor device of the present invention is highly reliable.

Figure 1:
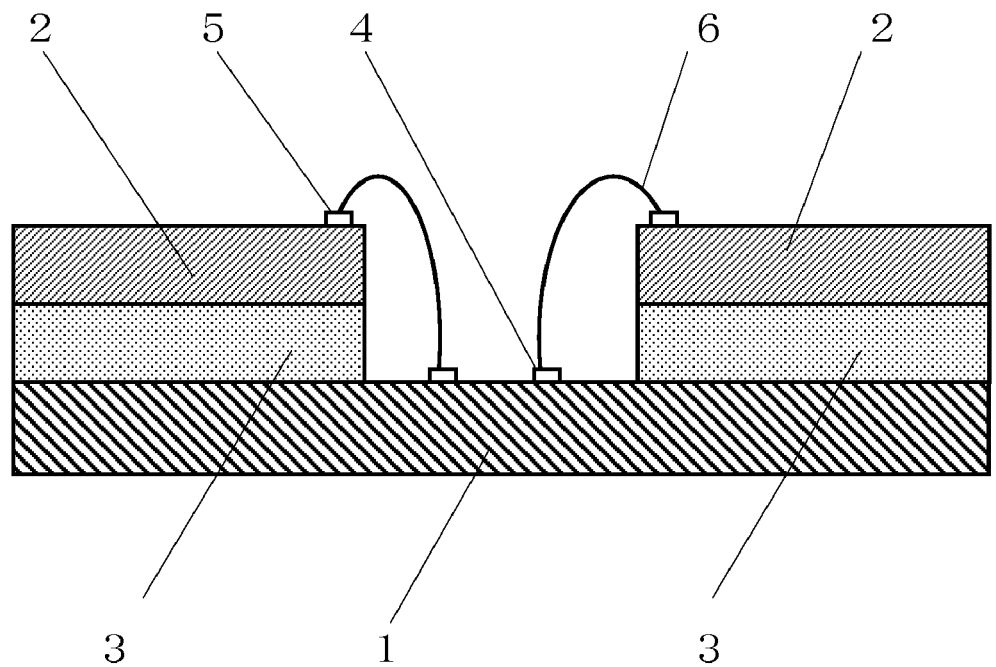
FIG. 1 is a sectional view of a semiconductor device manufactured in accordance with the present invention.

REFERENCE NUMERALS 1 semiconductor chip
2 circuit board made from a polyimide film
3 cured body of the insulating liquid die-bonding agent
4 bonding pad
5 bonding pad
6 metal bonding wire

DETAILED DESCRIPTION OF THE INVENTION

The following is a more detailed description of the insulating liquid die-bonding agent of the present invention.

Component (A) is one of the main components of the present die-bonding agent. It comprises a mixture of (a-1) an organopolysiloxane resin having an alkenyl group and (a-2) a linear-chain organopolysiloxane having in one molecule at least two alkenyl groups. Constituent (a-1) has a resinous molecular structure and is composed of siloxane units represented by the following formulae: $R^1_3SiO_{1/2}$; $R^1_2R^2SiO_{1/2}$; and $SiO_{4/2}$. In the above formulae, $R^1$ is a univalent hydrocarbon group other than an alkenyl group. This may be, e.g., a methyl, ethyl, propyl, butyl, pentyl, hexyl, heptyl, or a similar alkyl group; a phenyl, tolyl, xylyl, naphthyl, or a similar aryl group; a benzyl, phenethyl, or a similar aralkyl group; a chloromethyl, 3-chloropropyl, 3,3,3-trifluoropropyl, or a similar halogen-substituted alkyl group. In the above formula, $R^2$ designates an alkenyl group, such as a vinyl, allyl, butenyl, pentenyl, hexenyl, or a heptenyl group.

The aforementioned organopolysiloxane resin of constituent (a-1) may be represented by an organopolysiloxane copolymer composed of siloxane units represented by the following formulae: $(CH_3)_3SiO_{1/2}$; $(CH_3)_2(CH_2=CH)SiO_{1/2}$; and $SiO_{4/2}$; and an organopolysiloxane copolymer composed of siloxane units represented by the following formulae: $(C_6H_5)(CH_3)_2SiO_{1/2}$; $(CH_3)_2(CH_2=CH)SiO_{1/2}$; and $SiO_{4/2}$.

Constituent (a-2) is an organopolysiloxane that has a linear molecular structure. Alkenyl groups of constituent (a-2) may be exemplified by vinyl, allyl, butenyl, pentenyl, hexenyl, and heptenyl groups. Most preferable are vinyl groups. There are no special restrictions with regard to bonding positions of the aforementioned alkenyl groups. For example, they can be located on molecular terminals and/or in a side molecular chain. Silicon-bonded organic groups other than alkenyl groups contained in constituent (a-2) may be represented by methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; chloromethyl, 3-chloropropyl, 3,3,3-trifluoropropyl, or similar halogen-substituted alkyl groups. Most preferable are methyl and phenyl groups.

The following are specific examples of organopolysiloxane of constituent (a-2): a copolymer of methylvinylsiloxane and dimethylsiloxane capped at both molecular terminals with trimethylsiloxy groups; a methylvinylpolysiloxane capped at both molecular terminals with trimethylsiloxy groups; a copolymer of methylphenylsiloxane, methylvinylsiloxane, and dimethylsiloxane capped at both molecular terminals with trimethylsiloxy groups; a dimethylpolysiloxane capped at both molecular terminals with dimethylvinylsiloxy groups; methylvinylpolysiloxane capped at both molecular terminals with dimethylvinylsiloxy groups; a copolymer of methylvinylsiloxane and dimethylsiloxane capped at both molecular terminals with dimethylvinylsiloxy groups; and a copolymer of methylphenylsiloxane, methylvinylsiloxane, and dimethylsiloxane capped at both molecular terminals with dimethylvinylsiloxy groups.

There are no special restrictions with regard to the viscosity of constituent (a-2) at 25° C., but it is recommended to have this viscosity in the range of 10 to 1,000,000 mPa·s, preferably within the range of 100 to 100,000 mPa·s. If the viscosity is below the lower recommended limit, after printing the obtained die-bonding agent will flow out to the peripheral area, contaminate the wire-bond pad, and thus impair the quality of wire bonding. If, on the other hand, the viscosity exceeds the upper recommended limit, this will impair handlability of the obtained wire-bonding agent in the manufacturing process.

Component (A) consists of constituents (a-1) and (a-2) that are mixed in a mass ratio of (30:70) to (60:40). If the mass-ratio share of constituent (a-1) is below the lower recommended limit, this will impair physical strength in the cured die-bonding material. If, on the other hand, the share of constituent (a-1) exceeds the upper recommended limit, this will significantly reduce elongation of the aforementioned cured die-bonding material.

Component (B) is a curing agent of the present die-bonding agent. This component is an organopolysiloxane that contains in one molecule at least two silicon-bonded hydrogen atoms. There are no special restrictions with regard to the position of in which a hydrogen atom can be bonded to silicon. For example, a hydrogen atom may be located on the molecular terminals and/or in a side molecular chain. The following are specific examples of silicon-bonded organic groups that may be contained in component (B): methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; chloromethyl, 3-chloropropyl, 3,3,3-trifluoropropyl, or a similar halogen-substituted alkyl groups. Methyl and phenyl groups are preferable. There are no special restrictions with regard to the molecular structure of component (B). For example, this component may have a linear, branched, cyclic, net-like, or a partially-branched linear molecular structure. The linear structure is preferable.

The following are specific examples of the organopolysiloxane of component (B): a methylhydrogenpolysiloxane capped at both molecular terminals with trimethylsiloxy groups; a copolymer of methylhydrogensiloxane and dimethylsiloxane capped at both molecular terminals with trimethylsiloxy groups; a copolymer of methylphenylsiloxane methylhydrogensiloxane, and dimethylsiloxane capped at both molecular terminals with trimethylsiloxy groups; dimethylpolysiloxane capped at both molecular terminals with dimethylhydrogensiloxy groups; a copolymer of methylphenylsiloxane and dimethylsiloxane capped at both molecular terminals with dimethylhydrogensiloxy groups; a methylphenylpolysiloxane capped at both molecular terminals with dimethylhydrogensiloxy groups; an organopolysiloxane copolymer composed of siloxane units represented by the following formulae: $R^1_3SiO_{1/2}$; $R^1_2HSiO_{1/2}$; and $SiO_{4/2}$; an organopolysiloxane copolymer composed of siloxane units represented by the following formulae: $R^1_2HSiO_{1/2}$; and $SiO_{4/2}$; an organopolysiloxane copolymer composed of siloxane units represented by the following formulae: $R^1_3HSiO_{2/2}$; $R^1SiO_{3/2}$; and $HSiO_{3/2}$; or the above-mentioned organopolysiloxanes in a mixture of two or more. In the above formulae, $R^1$ designates univalent hydrocarbon groups other than alkenyl groups, such as methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; chloromethyl, 3-chloropropyl, 3,3,3-trifluoropropyl, or similar halogen-substituted alkyl groups.

There are no special restrictions with regard to the viscosity of component (B) at 25° C., but it is recommended to have this viscosity in the range of 1 to 500,000 mPa·s, preferably in the range of 5 to 100,000 mPa·s. If the viscosity is below the lower recommended limit, this will reduce mechanical strength of the cured die-bonding material. If, on the other hand, the viscosity exceeds the upper recommended limit, this will impair handlability of the obtained wire-bonding agent in the manufacturing process.

It is recommended to add component (B) in such an amount that the silicon-bonded hydrogen atoms of this components constitute 0.1 to 10 moles, preferably 0.1 to 5 moles, and even more preferably 0.1 to 3 moles per 1 mole of alkenyl groups in component (A). If the amount of silicon-bonded hydrogen atoms of component (B) per 1 mole of alkenyl groups in component (A) is below the lower recommended limit, it will be difficult to provide sufficient curing of the obtained die-bonding agent. If, on the other hand, the upper recommended limit is exceeded, with the lapse of time physical properties of the cured die-bonding material may change.

Component (C) is used for improving adhesion of the cured body obtained from the die-bonding agent of the invention. Component (C) is an organic silicon compound that contains in one molecule at least one silicon-bonded alkoxy group. The following are specific examples of the organic silicon compounds that constitute component (C): tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, 3-methacryloxypropyltrimethoxysilane, and silicon compounds represented by the following formulae:

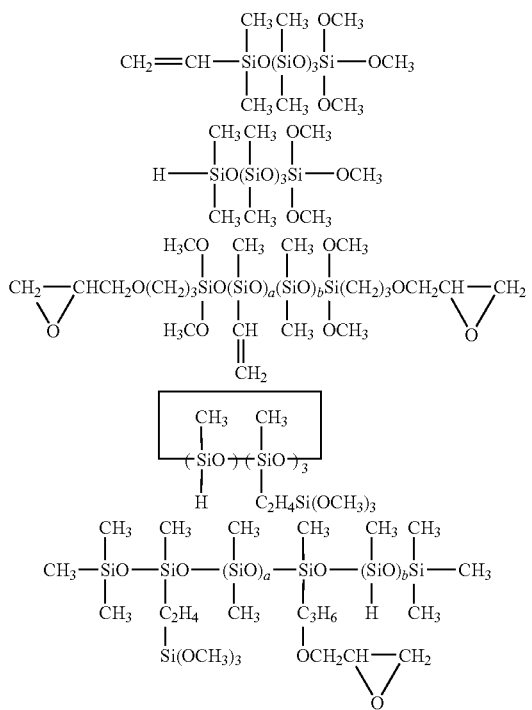

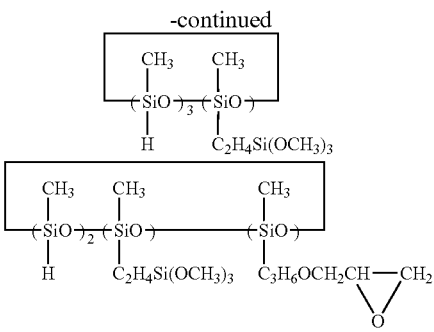

(in the above formulae, "a" and "b" are integers which are equal to or greater than 1). Among the above, the best adhesive strength in a cured body is obtained with the use of the organic silicon compounds of component (C) that contains in one molecule at least one silicon-bonded alkoxy group and at least one silicon-bonded alkenyl group or silicon bonded hydrogen atom.

Component (C) is added in an amount of 0.1 to 10 parts by mass, preferably 0.5 to 3.0 parts by mass per 100 parts of component (A). If component (C) is added in an amount less than the lower recommended limit, the obtained cured die-bonding material will have insufficient adhesive strength. If, on the other hand, component (C) is added in an amount exceeding the upper recommended limit, this will impair storage stability of the obtained die-bonding agent.

Component (D) is used for adjusting viscosity and thixotropic properties of the die-bonding agent in order to make it suitable for screen printing. This component contains spherical silicone rubber particles with insulating properties that function as a soft filler and reduce the risk of damaging the active surface of the semiconductor chip. The average diameter of the aforementioned particles of component (D) is in the range of 0.1 to 50 µm, preferably, in the range of 1 to 30 µm. If the average diameter of particles is below the lower recommended limit, voids may occur on the interface between the semiconductor chip and the chip-mounting member bonded with the use of the obtained die-bonding agent. If, on the other hand, the added amount of component (D) exceeds the upper recommended limit, this will impair filterability at the stage of removing foreign matter from the die-boning agent after the preparation of the agent is completed. Frequently, better results are obtained when component (D) is added in an aggregated state. This is because the aggregated insulating spherical silicone rubber particles preserve their cohesive state in the die-bonding agent, and this condition reduces risk of damaging the active surface of the semiconductor chip. It is recommended that the average diameter of the aggregated grains be in the range of 1 to 100 µm, preferably, 1 to 50 µm. The average diameter of the aggregated grains was determined by immersing the silicone rubber grains into methanol, dispersing them by applying ultrasonic energy, and then measuring the dimensions with the use of a particle size distribution measuring instrument. In order to prevent damage of the active surface of a semiconductor chip by component (D), it should have a durometer-A hardness according to JIS K 6253-1997 (Hardness testing methods for rubber, vulcanized or thermoplastic) equal to or below 80, preferably equal to or below 50.

Component (D) with such characteristics can be prepared by the methods described below. For example, a liquid silicone rubber composition is emulsified in water at a temperature of 0° C. to 25° C. with a surface-active agent to prepare an aqueous emulsion. The obtained emulsion is dispersed in water at a temperature equal to or above 25° C., and the obtained liquid silicone rubber composition is solidified to form particles in an aqueous suspension (see Kokai S62-243621 and U.S. Pat. No. 4,742,142). According to another method, particles are produced by preparing a silicone rubber composition from an organopolysiloxane having in one molecule at least two silicon-bonded hydroxyl groups, an organopolysiloxane having in one molecule at least two silicon-bonded hydrogen atoms, a curing accelerator, and an epoxy compound having in one molecule at least one unsaturated hydrocarbon group, emulsifying the obtained composition in an aqueous solution of a surface-active agent, bringing the emulsion in contact with a high-temperature liquid or gas, and curing the silicone rubber composition into a particulate form in an aqueous suspension (see Kokai S64-56735 and U.S. Pat. No. 4,849,564). Another method consists of preparing a silicone rubber composition from organopolysiloxane having in one molecule at least two alkenyl groups and an organopolysiloxane having in one molecule at least two silicon-bonded hydrogen atoms, emulsifying the obtained composition in an aqueous solution of a surface-active agent, adding a platinum-type catalyst, and recovering the particles in an aqueous-suspension form by curing the obtained silicone rubber composition (see Kokai H10-298302 and U.S. Pat. No. 5,969,039). Still another method consists of preparing a condensation-curable silicone rubber composition from an organopolysiloxane, which contains in one molecule at least two silanol groups, and a cross-linking agent, emulsifying the obtained composition in an aqueous solution of a surface-active agent, adding a condensation-reaction-type catalyst emulsified in an aqueous solution of a surface-active agent, and particulating the silicone rubber composition to produce an aqueous suspension of silicone rubber particles (see Kokai 2001-240679). The spherical silicone rubber particles are obtained from the aforementioned suspensions by subjecting the suspension to a uniform spray drying, the obtained spherical silicone rubber particles are stirred in water or an alkaline water solution, water is removed, the particles are stirred in water for the second time, the water is removed, e.g., in a centrifugal separator, and, if necessary, the particles are stirred in an aqueous solution of a lower alcohol, the alcohol is removed in a centrifugal separator or a similar apparatus, and the product is dried. According to another method, the suspension of the aforementioned silicone rubber particles is filtered, the spherical particles are recovered, the particles are again stirred in water or an aqueous alkaline solution, water is removed, the product is again stirred in water, the water is removed by centrifugal separation, and, if necessary, the product is stirred in a solution of a lower alcohol, the alcohol is separated by centrifugation, and the final powder is obtained by drying the product in a dryer.

It is recommended to add component (D) in an amount of 5 to 50 parts by mass, preferably 15 to 40 parts by mass per 100 parts by mass of component (A). If component (D) is added in an amount less than the upper recommended limit, this may cause contamination of the wire-bond pads because of excessive spreading of the composition. If, on the other hand, the added amount of component (D) exceeds the upper recommended limit, the composition will acquire excessive thixotropicity, and this will facilitate the formation of voids in the interface between the semiconductor chip and the die-bonding agent.

Component (E) is a hydrosilylation-reaction catalyst that is used for accelerating the curing of the die-bonding agent. Component (E) may be comprised of a platinum-type catalyst, rhodium-type catalyst, or palladium-type catalyst, of which the platinum-type catalyst is preferable. The aforementioned platinum-type catalyst can be represented by fine platinum powder, platinum black, platinum on a finely powdered silica carrier, platinum on an active-carbon carrier, chloroplatinic acid, platinum tetrachloride, an alcohol solution of chloroplatinic acid, a platinum-olefin complex, a complex of platinum with divinyltetramethyldisoloxane or a similar alkenylsiloxane, a polystyrene resin, nylon resin, polycarbonate resin, silicone resin, or a similar thermoplastic resin powder that contains the aforementioned platinum or a platinum-type compound that has a diameter of particles not exceeding 10 µm.

Component (E) should be used in an catalytic quantity. It, however, is recommended to add component (E) in terms of mass units of a metallic catalyst contained in this component in an amount of 0.1 to 500 ppm, preferably 1 to 50 ppm. If component (E) is added in an amount less than the lower recommended limit, this will significantly delay the speed of curing of the obtained die-bonding agent. If, on the other hand, the added amount exceeds the upper recommended limit, this will not cause significant acceleration in the speed of curing, but the process will become economically unjustifiable.

The die-bonding agent of the invention is prepared by uniformly mixing components (A) through (E). The die-bonding agent of the invention has a viscosity of 100 to 500 Pa·s, preferably 150 to 300 Pa·s at 25° C. If the die-bonding agent has a viscosity lower than the lower recommended limit, this may cause contamination of the wire-bond pad caused by spreading of the applied agent. If, on the other hand, the viscosity exceeds the upper recommended limit, this may cause formation of voids.

Within the limits that do not contradict the objects of the invention, the composition may include an arbitrary component such as a curing inhibitor that may be needed for improving storage stability and handleability of the obtained agent. Examples of such a curing inhibitor are the following: 2-methyl-3-butyn-2-ol, 3,5-dimethyl-1-hexyn-3-ol, phenylbutynol, or a similar alkyl alcohol; 3-methyl-3-penten-1-yne, 3,5-dimethyl-3-hexen-1-yne, or similar enyne compounds; 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. In terms of mass units, such curing inhibitors should be added to the die-bonding agent of the invention in an amount of 10 to 50,000 ppm. If necessary, in the limits not detrimental to the purposes of the invention, the composition may also contain other arbitrary additives such as pigments, heat-resistant agents, flame retardants, etc.

Next, a semiconductor device of the invention will be described in detail with reference to the accompanying drawing.

As shown in FIG. 1, a semiconductor device of the invention is the one wherein a semiconductor-chip-mounting member 2 is bonded to an active surface of a semiconductor chip 1 by means of a cured body 3 of the aforementioned die-bonding agent. In such a device, the semiconductor chip 1 may be comprised of an electronic circuit on silicon or gallium-arsenic substrate, and the semiconductor-chip-mounting member 2, which is known as a "tab", is made from copper, a ferrous alloy, or a similar alloy. In the embodiment of FIG. 1, the aforementioned semiconductor-chip-mounting member is shown as a circuit board. Such circuit board may comprise a ceramic or glass substrate on the surface of which wiring is formed from a metal such as gold, silver, copper, or the like. Furthermore, the circuit board may support on its surface various capacitors, resistors, coils, or other electrical elements.

The semiconductor device of the invention is formed by attaching the semiconductor-chip-mounting member to the active surface of the semiconductor chip 1 by means of the aforementioned die-bonding agent, heating the obtained unit for forming a cured body 3 of the bonding agent, and then performing a die-bonding operation through the use of die-bonding wires 6 made from gold, copper, aluminum, or another metal that connect the bonding pads 4 which are installed in the central part of the device on the active surface of the semiconductor chip 1 with the circuit board by means of bonding pads 5. Generally, wire bonding with the use of a bonding wire 6 is carried out by an ultrasonic compression bonding method, thermal compression bonding method, ultrasonic thermal compression bonding method, etc. Bonding of the semiconductor-chip-mounting member 2 to the active surface of the semiconductor chip 1 by means of the above-described die-bonding agent through the cured body 3 of the aforementioned die-bonding agent can be carried out, e.g., by the following two methods: the die-bonding agent is applied onto the semiconductor-chip-mounting member 2, and then the semiconductor chip 1 is bonded to the die-bonding agent; or the die-bonding agent is applied onto the semiconductor chip 1, and then the semiconductor-chip-mounting member 2 is placed onto the semiconductor chip 1, and the die-bonding agent is cured by heating. There are no special limitations with regard to the temperature at which the die-bonding agent can be cured. For example, the temperature can be in the range of 100 to 250° C., preferably in the range of 150 to 250° C. Furthermore, if necessary, after wire bonding of the semiconductor chip is completed, the surface of the semiconductor chip 1 can be coated with a gel-like or rubber-like silicone coating agent. If necessary, the semiconductor chip can be sealed with an epoxy-resin sealant.

EXAMPLES

The invention will be further described in more detail with reference to Practical Examples and Comparative Examples of the insulating liquid die-bonding agent and semiconductor device. Values of viscosity were measured at 25° C. The following methods were used for determining characteristics of the die-bonding agent and semiconductor device.

[Measurement of Viscosity and Thixotropy of the Die-Bonding Agent]

Viscosity of the die-bonding agent was measured by means of an E-type rotary viscometer (Model DVU-EII, the product of Tokimec Co., Ltd) at a rotary speed of 0.5 rpm. Thixotropic properties of the die-bonding agent were measured with the use of the aforementioned rotary-type viscometer by determining the viscosity at the rotary speed of 0.5 rpm as compared to the rotary speed of 2.5 rpm, and the index of thixotropy was determined on the basis of the obtained data.

[Evaluation of Voids]

The die-bonding agent was applied onto a polyamide film by screen printing in the form of a coating having a thickness of 50 μm and occupying the area of 8 mm×8 mm. A transparent glass plate that had the dimensions of 18 mm×18 mm and a thickness of 150 μm was chosen for use in conjunction with the semiconductor chip and was applied, and the die-bonding agent was compressed to the thickness of 25 μm. The unit was heated for 1 min. at 200° C., whereby the die-bonding agent was cured, and the existence of voids (air bubbles) on the interface between the glass plate and the cured die-bonding agent was checked by observing the interface from the glass plate side.

[Evaluation of Semiconductor Device Manufacture and Bondability]

The active surface of the semiconductor chip was attached to the rear surface of the polyamide-film circuit board that supports the aforementioned semiconductor-chip-mounting member, and then the unit was heated for 1 min. at 200° C., whereby the die-bonding agent was cured. Following this, the bonding pads located in the center of the active surface of the semiconductor chip were wire-bonded by means of bonding wires to the bonding pads installed on the edges of the polyamide-film circuit board. The wire bonding of the bonding wires was carried out by the ultrasonic thermal compression method (bonding temperature: 160 to 250° C.; load: 30 to 100 mg/per wire). The condition of the bonding wire and the bonding pad or the shape of the bonding wire and the bonding pad necks was observed under a microscope. The bonding condition of the bonding wire was observed while the bonding wire was stretched, and wire bondability was determined in terms of the percentage of failed bonding wires compared to the total number of bonding wires.

[Percentage of Operational Failure of Semiconductor Device]

The tested semiconductor device was subjected to 100 thermal cycles wherein each cycle consisted of 15 min. at −25° C. and 15 min. at +120° C. Following this, the tested device was removed from the thermal-cycle chamber, and the percentage of operational failure was determined.

Practical Example 1

An organopolysiloxane mixture was prepared from: 40 parts by mass of an organopolysiloxane resin (the content of vinyl groups=2.01 mass %) composed of siloxane units of formula $(CH_3)_3SiO_2$, siloxane units of formula $(CH_3)_2(CH_2=CH)SiO_{1/2}$, and siloxane units $SiO_{4/2}$; and 60 parts by mass of a dimethylpolysiloxane (the content of vinyl groups=0.23 mass %) that was capped at both molecular terminals with dimethylvinylsiloxy groups and had a viscosity of 2,000 mPa·s. The mixture was combined with 20 parts by mass of spherical silicone rubber particles that had an average diameter of 2 μm, an average diameter of aggregated particles equal to 15 μm, and a type-A durometer hardness of 30. The components were mixed for 30 min. at room temperature. As a result, a uniform paste-like compound was obtained. This compound was further combined with: 3.5 parts of a methylhydrogenpolysiloxane (the content of silicon-bonded hydrogen atoms=1.5 mass %) that was capped at both molecular terminals with trimethylsiloxy groups and had a viscosity of 20 mPa·s (the content of silicon-bonded hydrogen atoms in the present methylhydrogenpolysiloxane was 1.5 moles per 1 mole of vinyl groups in the aforementioned organopolysiloxane mixture); 1 part by weight of an organic silicon compound of the following formula:

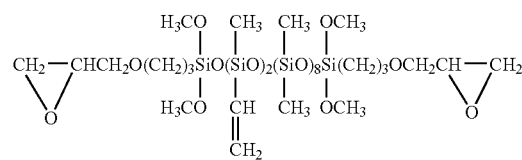

and 0.13 parts by mass of phenylbutynol. The components were mixed for 10 min. at room temperature, and an insulating liquid die-bonding agent was prepared by adding 0.45 parts by mass of a complex of platinum with 1,3-divinyltetramethyldisiloxane (where in terms of mass units, the content of metal platinum in the die-bonding agent was 5 ppm) and mixing the product for 30 min. at room temperature. The obtained die-bonding agent was checked with regard to its properties, and characteristics of the semiconductor device manufactured with the use of the aforementioned die-bonding agent were also evaluated. The results are shown in Table 1.

Practical Example 2

An organopolysiloxane mixture was prepared from: 45 parts by mass of an organopolysiloxane resin (the content of vinyl groups=2.01 mass %) composed of siloxane units of formula $(CH_3)_3SiO_2$, siloxane units of formula $(CH_3)_2(CH_2=CH)SiO_{1/2}$, and siloxane units $SiO_{4/2}$; and 55 parts by mass of a dimethylpolysiloxane (the content of vinyl groups=0.23 mass %) that was capped at both molecular terminals with dimethylvinylsiloxy groups and had a viscosity of 2,000 mPa·s. The mixture was combined with 10 parts by mass of spherical silicone rubber particles that had an average diameter of 2 μm, an average diameter of aggregated particles equal to 15 Mm, and a type-A durometer hardness of 30. The components were mixed for 30 min. at room temperature. As a result, a uniform paste-like compound was obtained. This compound was further combined with: 3.5 parts of a methylhydrogenpolysiloxane (the content of silicon-bonded hydrogen atoms=1.5 mass %) that was capped at both molecular terminals with trimethylsiloxy groups and had a viscosity of 20 mPa·s (the content of silicon-bonded hydrogen atoms in the present methylhydrogenpolysiloxane was 1.4 moles per 1 mole of vinyl groups in the aforementioned organopolysiloxane mixture); 1 part by weight of an organic silicon compound of the following formula:

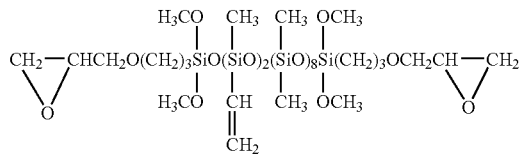

and 0.13 parts by mass of phenylbutynol. The components were mixed for 10 min. at room temperature, and an insulating liquid die-bonding agent was prepared by adding 0.45 parts by mass of a complex of platinum with 1,3-divinyltetramethyldisiloxane (where, in terms of mass units, the content of metal platinum in the die-bonding agent was 5 ppm) and mixing the product for 30 min. at room temperature. The obtained die-bonding agent was checked with regard to its properties, and characteristics of the semiconductor device manufactured with the use of the aforementioned die-bonding agent were also evaluated. The results are shown in Table 1.

Practical Example 3

An organopolysiloxane mixture was prepared from: 35 parts by mass of an organopolysiloxane resin (the content of vinyl groups=2.01 mass %) composed of siloxane units of formula $(CH_3)_3SiO_2$, siloxane units of formula $(CH_3)_2(CH_2=CH)SiO_{1/2}$, and siloxane units $SiO_{4/2}$; and 65 parts by mass of a dimethylpolysiloxane (the content of vinyl groups=0.08 mass %) that was capped at both molecular terminals with dimethylvinylsiloxy groups and had a viscosity of 40,000 mPa·s. The mixture was combined with 20 parts by mass of spherical silicone rubber particles that had an average diameter of 2 μm, an average diameter of aggregated particles equal to 15 μm, and a type-A durometer hardness of 30. The components were mixed for 30 min. at room temperature. As a result, a uniform paste-like compound was obtained. This compound was further combined with: 3.5 parts of a methylhydrogenpolysiloxane (the content of silicon-bonded hydrogen atoms=1.5 mass %) that was capped at both molecular terminals with trimethylsiloxy groups and had a viscosity of 20 mPa·s (the content of silicon-bonded hydrogen atoms in the present methylhydrogenpolysiloxane was 1.9 moles per 1 mole of vinyl groups in the aforementioned organopolysiloxane mixture); 1 part by weight of an organic silicon compound of the following formula:

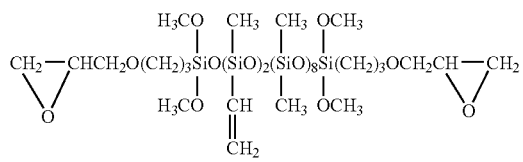

and 0.13 parts by mass of phenylbutynol. The components were mixed for 10 min. at room temperature, and an insulating liquid die-bonding agent was prepared by adding 0.45 parts by mass of a complex of platinum with 1,3-divinyltetramethyldisiloxane (where, in terms of mass units, the content of metal platinum in the die-bonding agent was 5 ppm) and mixing the product for 30 min. at room temperature. The obtained die-bonding agent was checked with regard to its properties, and characteristics of the semiconductor device manufactured with the use of the aforementioned die-bonding agent were also evaluated. The results are shown in Table 1.

Comparative Example 1

An insulating liquid die-bonding agent was prepared in the same manner as in Practical Example 1, except that 100 parts by mass of a dimethylpolysiloxane (the content of vinyl groups=0.23 mass %) that was capped at both molecular terminals with dimethylvinylsiloxy groups and that had a viscosity of 2000 mPa·s were used instead of 100 parts by mass of the mixture of Practical Example 1 composed of 40 parts by mass of an organopolysiloxane resin (the content of vinyl groups=2.01 mass %) composed of siloxane units of formula $(CH_3)_3SiO_2$, siloxane units of formula $(CH_3)_2(CH_2=CH)SiO_{1/2}$, and siloxane units $SiO_{4/2}$ and 60 parts by mass of a dimethylpolysiloxane (the content of vinyl groups=0.23 mass %) that was capped at both molecular terminals with dimethylvinylsiloxy groups and had a viscosity of 2,000 mPa·s. The composition of Comparative Example 1 also contained methylhydrogenpolysiloxane (the content of silicon-bonded hydrogen atoms=1.5 mass %) that was capped at both molecular terminals with trimethylsiloxy groups and had a viscosity of 20 mPa·s (the content of silicon-bonded hydrogen atoms in the present methylhydrogenpolysiloxane was 1.6 moles per 1 mole of vinyl groups in the aforementioned dimethylpolysiloxane). The obtained die-bonding agent was checked with regard to its properties, and characteristics of the semiconductor device manufactured with the use of the aforementioned die-bonding agent were also evaluated. The results are shown in Table 1.

Comparative Example 2

An insulating liquid die-bonding agent was prepared in the same manner as in Comparative Example 1, except that spherical silicone rubber particles were used in an amount of 60 parts by mass. The obtained die-bonding agent was checked with regard to its properties, and characteristics of the semiconductor device manufactured with the use of the aforementioned die-bonding agent were also evaluated. The results are shown in Table 1.

Comparative Example 3

In the composition of Practical Example 1, the organopolysiloxane mixture was prepared from 70 parts by mass of an organopolysiloxane resin (the content of vinyl groups= 2.01 mass %) composed of siloxane units of formula $(CH_3)_3SiO_{1/2}$, siloxane units of formula $(CH_3)_2(CH_2=CH)SiO_{1/2}$, and siloxane units $SiO_{4/2}$; and 30 parts by mass of a dimethylpolysiloxane (the content of vinyl groups=0.23 mass %) that was capped at both molecular terminals with dimethylvinylsiloxy groups and had a viscosity of 2,000 mPa·s. However, the mixture could not be brought to uniformity, and a homogenous die-bonding agent could not be prepared.

TABLE 1

| | Examples | | | | |
|---|---|---|---|---|---|
| | Practical Examples | | | Comparative Examples | |
| Characteristics | 1 | 2 | 3 | 1 | 2 |
| Viscosity (Pa · s) | 220 | 200 | 190 | 60 | 190 |
| Index of Thixotropy | 1.5 | 1.3 | 1.5 | 1.5 | 2.1 |
| Void Formation Ratio | 0/30 | 0/30 | 0/30 | 0/30 | 15/30 |
| Wire Bonding Failure | 0/100 | 0/100 | 0/100 | 100/100 | Not measurable |
| Operative Failure | 0/30 | 0/30 | 0/30 | Not measurable | |

INDUSTRIAL APPLICABILITY

Since the insulating liquid die-bonding agent of the invention does not damage the active surface of a semiconductor chip, is well suited for screen printing, is resistant to the formation of voids on the interface between the semiconductor chip and the die-bonding agent, and does not lose its wire-bonding properties, it is capable of improving reliability of a semiconductor device.

The invention claimed is:

1. An insulating liquid die-bonding agent for bonding a semiconductor-chip-mounting member to an active surface of a semiconductor chip, said agent comprising:
 (A) 100 parts by mass of a mixture of (a-1) an organopolysiloxane resin composed of siloxane units of formula $R^1_3SiO_{1/2}$, siloxane units of formula $R^1_2R^2SiO_{1/2}$, and siloxane units of formula $SiO_{4/2}$ (wherein $R^1$ is a univalent hydrocarbon group, except for an alkenyl group, and $R^2$ is an alkenyl group) and (a-2) a linear-chain organopolysiloxane having in one molecule at least two alkenyl groups, with a mass ratio of (a-1) to (a-2) in the range of (30:70) to (60:40);
 (B) an organopolysiloxane having in one molecule at least two silicon-bonded hydrogen atoms, where component (B) is used in such an amount that the mole ratio of the silicon-bonded hydrogen atoms of this component to 1 mole of alkenyl groups of component (A) is within the range of 0.1 to 10 moles;
 (C) 0.1 to 10 parts by mass of an organic silicon compound having in one molecule at least one silicon-bonded alkoxy group;
 (D) 5 to 50 parts by mass of insulating spherical silicone rubber particles having an average diameter of 0.1 to 50 µm and having a type A durometer hardness according to JIS K 6253 equal to or below 80; and
 (E) a catalytic quantity of a hydrosilylation-reaction catalyst;
 wherein component (D) is aggregated with an average diameter of aggregated particles of 1 to 100 µm.

2. The insulating liquid die-bonding agent of claim 1, having a viscosity of 100 to 500 Pa·s at 25° C.

3. A semiconductor device wherein a semiconductor-chip-mounting member is bonded to an active surface of a semiconductor chip with the use of the insulating liquid die-bonding agent of claim 2.

4. The insulating liquid die-bonding agent of claim 2, having a viscosity of 150 to 300 Pa·s at 25° C.

5. A semiconductor device wherein a semiconductor-chip-mounting member is bonded to an active surface of a semiconductor chip with the use of the insulating liquid die-bonding agent of claim 1.

6. The insulating liquid die-bonding agent of claim 1, wherein component (D) has a type A durometer hardness according to JIS K 6253 equal to or below 50.

7. The insulating liquid die-bonding agent of claim 1, wherein component (D) has an average diameter of 0.1 to 30 µm.

8. The insulating liquid die-bonding agent of claim 1, wherein component (D) is present from 15 to 40 parts by mass.

9. The insulating liquid die-bonding agent of claim 1, wherein component (B) is used in such an amount that the mole ratio of the silicon-bonded hydrogen atoms of component (B) to 1 mole of alkenyl groups of component (A) is within the range of from 0.1 to 5 moles.

10. The insulating liquid die-bonding agent of claim 1, wherein (a-1) is represented by an organopolysiloxane copolymer comprising siloxane units selected from the following formulae: $(CH_3)_3SiO_{1/2}$; $(CH_3)_2(CH_2=CH)SiO_{1/2}$; and $SiO_{4/2}$; and an organopolysiloxane copolymer comprising siloxane units selected from the following formulae: $(C_6H_5)(CH_3)_2SiO_{1/2}$; $(CH_3)_2(CH_2=CH)SiO_{1/2}$; and $SiO_{4/2}$.

11. The insulating liquid die-bonding agent of claim 10, wherein (a-2) is selected from the group of: a copolymer of methylvinylsiloxane and dimethylsiloxane capped at both molecular terminals with trimethylsiloxy groups; a methylvinylpolysiloxane capped at both molecular terminals with trimethylsiloxy groups; a copolymer of methylphenylsiloxane, methylvinylsiloxane, and dimethylsiloxane capped at both molecular terminals with trimethylsiloxy groups; a dimethylpolysiloxane capped at both molecular terminals with dimethylvinylsiloxy groups; methylvinylpolysiloxane capped at both molecular terminals with dimethylvinylsiloxy groups; a copolymer of methylvinylsiloxane and dimethylsiloxane capped at both molecular terminals with dimethylvinylsiloxy groups; and a copolymer of methylphenylsiloxane, methylvinylsiloxane, and dimethylsiloxane capped at both molecular terminals with dimethylvinylsiloxy groups.

12. The insulating liquid die-bonding agent of claim 1, wherein the average diameter of aggregated particles is 1 to 50 µm.

* * * * *